(12) United States Patent
Ritter et al.

(10) Patent No.: US 8,878,534 B2
(45) Date of Patent: Nov. 4, 2014

(54) METHOD AND DEVICE TO DETERMINE A MAGNETIC RESONANCE SYSTEM ACTIVATION SEQUENCE

(75) Inventors: Dieter Ritter, Fuerth (DE); Stefan Scholl, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 356 days.

(21) Appl. No.: 13/331,434

(22) Filed: Dec. 20, 2011

(65) Prior Publication Data

US 2012/0161764 A1 Jun. 28, 2012

(30) Foreign Application Priority Data

Dec. 20, 2010 (DE) .......................... 10 2010 063 565

(51) Int. Cl.
*G01V 3/00* (2006.01)
*G01R 33/561* (2006.01)
*G01R 33/483* (2006.01)

(52) U.S. Cl.
CPC ........ *G01R 33/4836* (2013.01); *G01R 33/5612* (2013.01)
USPC .......................................... 324/309; 324/307

(58) Field of Classification Search
USPC ................... 324/309, 307, 314, 312
See application file for complete search history.

(56) References Cited

U.S. PATENT DOCUMENTS

| 7,221,162 | B2* | 5/2007 | Feiweier et al. | 324/318 |
|---|---|---|---|---|
| 7,403,004 | B2* | 7/2008 | Morich et al. | 324/309 |
| 8,217,652 | B2* | 7/2012 | Dannels | 324/309 |
| 8,368,400 | B2 | 2/2013 | Haas et al. | |
| 8,427,157 | B2* | 4/2013 | Fautz et al. | 324/314 |
| 2010/0066362 | A1 | 3/2010 | Ullmann | |

OTHER PUBLICATIONS

"Designing Multichannel, Multidimensional, Arbitrary Flip Angle RF Pulses Using an Optimal Control Approach," Xu et al., Magnetic Resonance in Medicine, vol. 59 (2008) pp. 547-560.
"Spatial Domain Method for the Design of RF Pulses in Multicoil Parallel Excitation," Grissom et al., Magnetic Resonance in Medicine, vol. 56 (2006) pp. 620-629.

* cited by examiner

*Primary Examiner* — Louis Arana
(74) *Attorney, Agent, or Firm* — Schiff Hardin LLP

(57) ABSTRACT

In a method and a control sequence determination device and a magnetic resonance system for the determination of a magnetic resonance system activation sequence as a multichannel pulse train with multiple individual RF pulse trains to be emitted in parallel by the magnetic resonance system respectively via multiple independent radio-frequency transmission channels of a transmission device, the multichannel pulse train is calculated in order to achieve a defined local target magnetization distribution upon emission of the calculated multichannel pulse train. The local target magnetization distribution is obtained as a parameter map determined from image data obtained with preceding measurement.

14 Claims, 6 Drawing Sheets

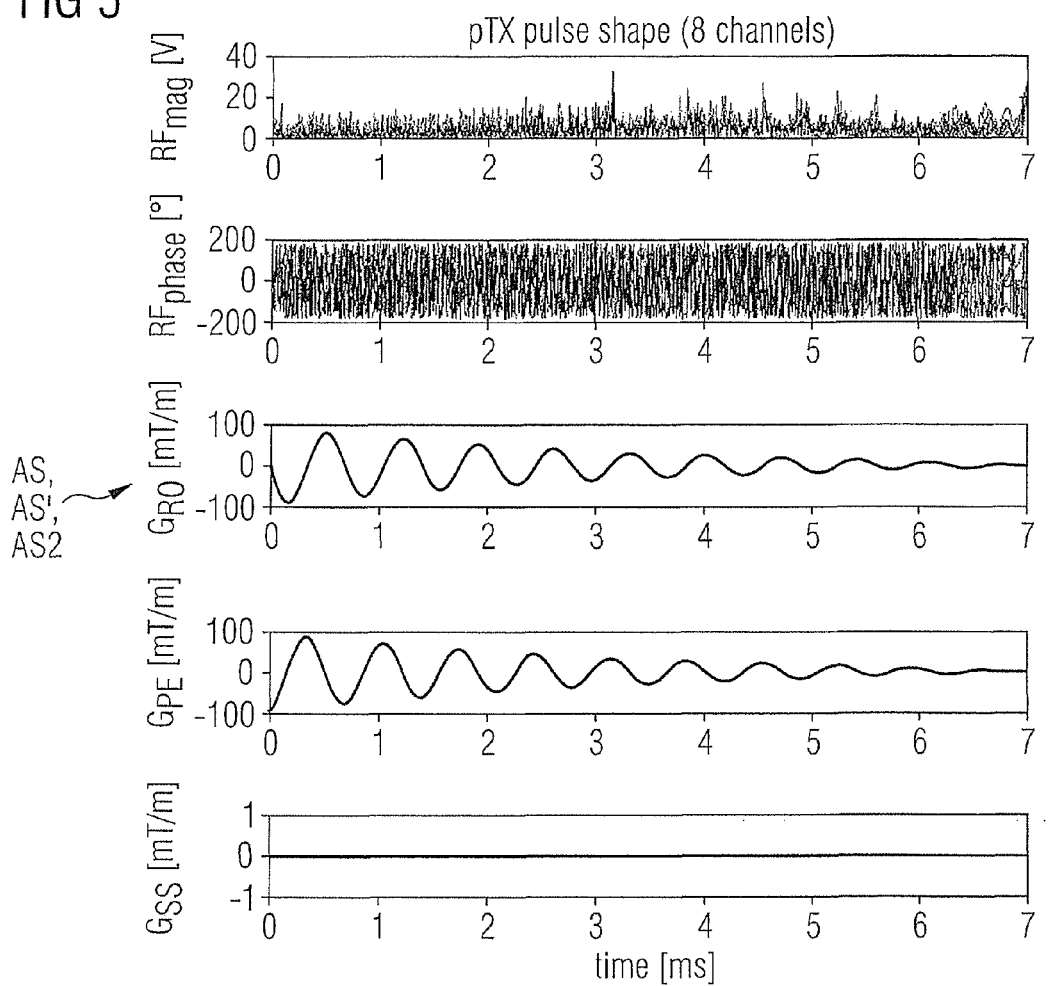
FIG 5
AS, AS', AS2
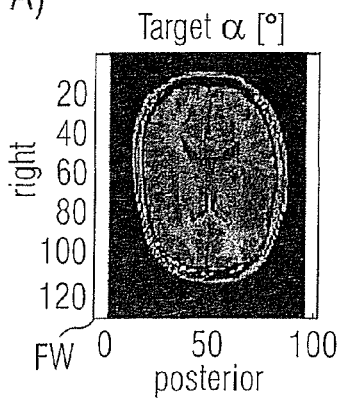
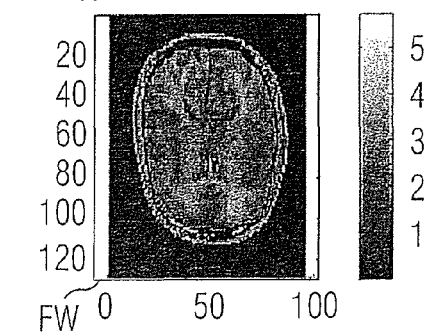
FIG 6
A) Target α [°]
B) Flipangle $\alpha_{mean}=2.4017°$, $\alpha_{rms}=0.32257°$

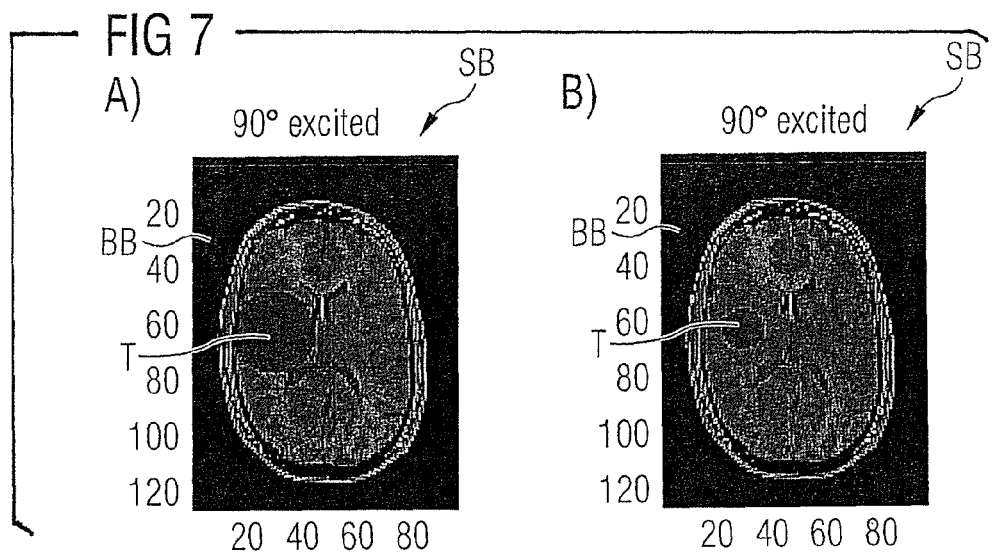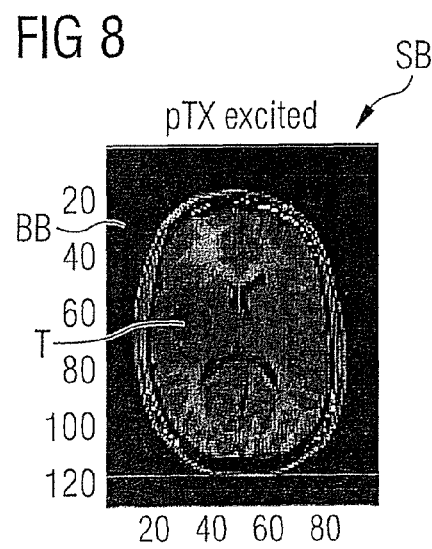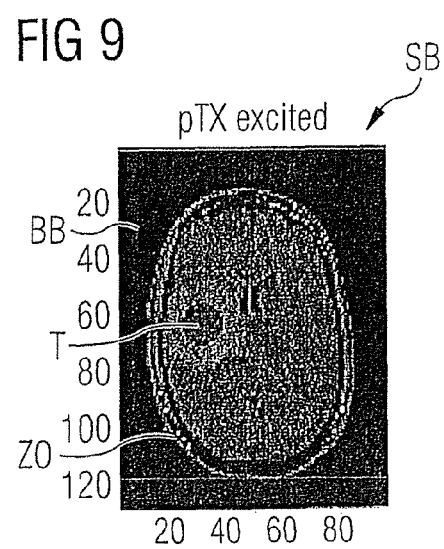

METHOD AND DEVICE TO DETERMINE A MAGNETIC RESONANCE SYSTEM ACTIVATION SEQUENCE

BACKGROUND OF THE INVENTION

1. Field of the Invention

The invention concerns a method and a control sequence determination device to determine a magnetic resonance system activation sequence for a follow-up measurement (following a first measurement of a selected image region of an examination subject) for at least a portion of the selected image region of the examination subject, the activation sequence including a multichannel pulse train with multiple, individual RF pulse trains to be emitted in parallel via different, independent radio-frequency transmission channels of a transmission device, wherein a multichannel pulse train is determined in order to achieve a defined, local target magnetization distribution upon emission of the calculated multichannel pulse train MP.

Moreover, the invention concerns a magnetic resonance system with a transmission device with a plurality of independent radio-frequency transmission channels, and a control device which is designed in order to emit a multichannel pulse train with multiple, parallel, individual RF pulse trains via the different radio-frequency transmission channels for implementation of a desired measurement based on a predetermined activation sequence.

2. Description of the Prior Art

In a magnetic resonance system, the body to be examined is typically exposed (with a basic field magnet system) to a relatively high basic field magnet field (is known as the $B_0$ field) of 1.5 Tesla, 3 Tesla or 7 Tesla, for example. A magnetic field gradient is additionally applied with the aid of a gradient system. By means of suitable antenna devices, radio-frequency excitation signals (RF signals) are then emitted via a radio-frequency transmission system, causing the nuclear spins of specific atoms to be excited to resonance by this radio-frequency field and tilted by a defined flip angle relative to the magnetic field lines of the basic magnetic field. The radio-frequency magnetic field is also designated as a $B_1$ field. This radio-frequency excitation or the resulting flip angle distribution is designated as a nuclear magnetization (or just "magnetization") in the following. Upon relaxation of the nuclear spins, radio-frequency signals—known as magnetic resonance signals—are radiated and are received by means of suitable reception antennas and then are processed further. Finally, the desired image data can be reconstructed from the raw data acquired in such a manner. The emission of the radio-frequency signals for nuclear magnetic resonance magnetization for the most part takes place by means of what is known as a "whole body coil" or "body coil". A typical design for this is a cage antenna (birdcage antenna) that has multiple transmission rods arranged parallel to the longitudinal axis and around a patient space of the scanner in which the patient is located during the examination. The antenna rods are connected with one another in an annular, capacitive fashion at their ends.

It has previously been typical to operate whole-body antennas in a "homogeneous mode", for example a "CP mode". For this purpose, a single, temporal RF signal is provided to all components of the transmission antenna, for example all transmission rods of a birdcage antenna. The transmission of the pulses to the individual components may take place with a phase offset, with a shift adapted to the geometry of the transmission coil. For example, in the case of a birdcage antenna with 16 rods, the rods can respectively be activated with the same RF signal with a phase shift offset of 22.5°.

For newer magnetic resonance systems, it has by now become possible to allocate individual RF signals, adapted to the imaging, to the individual transmission channels (which, for example, are associated with the individual rods of a birdcage antenna). For this purpose, a multichannel pulse train is emitted that, as described above, includes multiple individual radio-frequency pulse trains that can be emitted in parallel via the different, independent radio-frequency transmission channels. Due to the parallel emission of the individual pulses and as a "pTX pulse", such a multichannel pulse train can be used as an excitation pulse, refocusing pulse and/or inversion pulse. The previous homogeneous excitation can thereby be replaced with an excitation of (in principle) arbitrary shape in the measurement space, and consequently also in the patient.

Such multichannel pulse trains are typically generated in advance for a defined, planned measurement. For this purpose, the individual RF pulse trains—i.e. the RF trajectories—are determined in an RF pulse optimization method for the individual transmission channels over time, depending on a "k-space gradient trajectory". The "transmission k-space gradient trajectory" (in the following abbreviated only as "k-space gradient trajectory" or "gradient trajectory") is the locations in k-space that are occupied at defined times by adjustment of the individual gradients. K-space is the positional frequency space, and the gradient trajectory in k-space describes the path along which points in k-space are temporally traversed upon emission of an RF pulse, or the parallel pulses, by appropriate switching of the gradient pulses. At which spatial frequencies specific RF energy magnitudes are caused to occur can thus be determined by adjusting the gradient trajectory in k-space, i.e. by adjusting the matching gradient trajectory applied parallel to the multichannel pulse train. In the definition of a gradient trajectory it is to be noted that the relevant regions in k-space must also be traversed. For example, if an area sharply delimited in position space—a rectangle or oval, for example—should be excited, k-space should also be well covered in its outer boundary region. In contrast to this, if only a fuzzy boundary is desired, a coverage in the middle k-space region is sufficient.

Moreover, the user provides a local target magnetization distribution—for example a desired flip angle distribution—for the planning of the RF pulse sequence.

The matching RF pulse sequence for the individual channels is then calculated with a suitable optimization program so that the local target magnetization distribution is achieved. For example, a method to develop such multichannel pulse trains in parallel excitation methods is described by W. Grishom et al.: "Spatial Domain Method for the Design of RF Pulses in Multicoil Parallel Excitation", Mag. Res. Med. 56, 620-629, 2006.

For a defined measurement, the different multichannel pulse trains (that are to be emitted via the different transmission channels of the transmission device), the gradient pulse train (with matching x-, y- and z-gradient pulses) that is to be emitted in a coordinated manner for this purpose, and additional control specifications, are defined in a set of instructions or commands known as a measurement protocol which is created in advance and can be retrieved (for example from a memory) for a defined measurement and modified on site by the operator if necessary. While the measurement (data acquisition) takes place, the control of the magnetic resonance system ensues wholly automatically based on this measurement protocol, with the control device of the magnetic resonance system reading out the commands from the measurement protocol and executing them.

MR imaging represents an important measurement method in diagnostics and therapy in clinical practice. Particularly in therapy for oncological patients, process controls are to be implemented before, during and after therapy involving tissue-destroying methods. For example, tumor tissue and its dimensions can be monitored in the therapy. However, a reliable comparability of the relevant tissue dimensions detected by measurements that are separated in time is not possible without additional measures. The reproducibility of the slice positions and the variation of the tissue itself are a hindrance to reliable comparability between the measurement series.

SUMMARY OF THE INVENTION

An object of the present invention is to provide a suitable method and a corresponding control sequence determination device to determine magnetic resonance activation sequences, which simplify the implementation of such measurements, in particular to assess the treatment progress.

As described above, in the method according to the invention a multichannel pulse train is calculated in an RF pulse optimization method on the basis of a predetermined, local target magnetization distribution for a follow-up measurement following a first measurement. According to the invention, for this purpose a parameter map that is used to determine the local target magnetization distribution is obtained from image data determined with the first measurement. As used herein a "parameter map" is a field or a matrix of individual parameter values based on which the target magnetization is respectively established at the individual locations within the image region. This means that a defined value is found in the parameter map, for example for each voxel of a three-dimensional image region. In the simplest case, the image data—meaning the intensity values of the voxels, for example—can be adopted from the first measurement itself as a parameter map. However, the image data of the first measurement can likewise be modified (inverted, for example) to determine the parameter map, or the parameter map is calculated in another manner from the image data of the first measurement. Different examples for this are explained in detail below.

Image data of a first measurement are thus used that were acquired in an examination at the beginning of a destructive therapy of an oncological patient (the examination subject), for example. This first measurement concerns an image region with, for example, a selected slice thickness and orientation, wherein a target subject—for example a tumor of the patient—is located at a defined position within the image region. The image region is normally a segment of the examination subject that is to be determined by an operator of the magnetic resonance system, which segment should be displayed in order to visualize the tumor. The image region can be rectangular or octagonal if it is two-dimensional data. However, the image region can also have three dimensions so that, in this case, the image region can be cuboid, for example.

For example, a destructive therapy can follow the first measurement, the progress of which destructive therapy should be established by one or more follow-up measurements. The same image region is appropriately selected for the follow-up measurement, and the measurement is implemented again with the same slice thickness and orientation, for example, in order to ensure that the target subject is located at the same position in the image region of the follow-up measurement. However, it is also possible to use different large image regions for the first measurement and the follow-up measurement, for example such that the image region of the follow-up measurement is larger in area than the image region of the first measurement, meaning that the image region of the follow-up measurement is contained in the image region of the first measurement, or vice versa insofar as the target subject is visible in both image regions. The position of the target subject should advantageously be identical in both image regions, for example centrally in the middle, in order to enable a particularly simple comparison.

The local target magnetization distribution used for the follow-up measurement thereby differs from the local target magnetization distribution used for the first measurement, which is also called the primary magnetization in the following. Two different magnetic resonance system activation sequences are thus used in order to generate an additional slice image, for example given an image region that is advantageously otherwise identical and given the same slice thickness and orientation.

By the use of the parameter map based on the image data of the first measurement to determine the local target magnetization, the attitude and dimensions of the target subject can be embedded automatically and (for example) be visualized in the image data of the follow-up measurement since this information also enters into the follow-up measurement via the use of the parameter map. Image data from the follow-up measurement are thus present as a result, which image data contain both the target subject (indirectly via the specific, local target magnetization distribution) with the attitude and the dimensions at the point in time of the first measurement (for example at the beginning of the therapy) and the target subject at the point in time of the process monitoring, and thus allow a direct assessment of the therapy progress after the visualization of the image data. Automatic representations thus exist that allow a direct assessment of the treatment progress, and in fact without an operator having to mark the target subject (for example the tumor) by hand beforehand by means of an image processing device.

A control sequence determination device of the aforementioned type according to the invention is designed to determine a magnetic resonance system activation sequence for a follow-up measurement, wherein the magnetic resonance system activation sequence is a multichannel pulse train with multiple, individual RF pulse trains to be emitted in parallel by the magnetic resonance system via different, independent radio-frequency transmission channels of a transmission device. The control sequence determination device thereby determines a multichannel pulse train in order to achieve a defined, local target magnetization distribution in a selected image region (BD) upon emission of the calculated multichannel pulse train.

For this the control sequence determination device has an input interface to receive image data of the first measurement. As additional components, the control sequence determination device according to the invention has a target magnetization determination device (which determines a local target magnetization distribution from a parameter map based on the image data) and an RF pulse optimization unit that is designed so that it calculates the multichannel pulse train in an RF pulse optimization method on the basis of a local target magnetization distribution.

Significant parts of the control sequence determination device—in particular the target magnetization determination device and the RF pulse optimization unit—can be designed in the form of software components. The input interface can be an interface in order to select and adopt the image data of the first measurement from a data memory arranged within the control sequence determination device or connected with this via a network (possibly also using a user interface). For example, it can be a user interface—in particular a graphical user interface—that can also serve for manual input of a target magnetization for the first measurement. The control sequence determination device may also have a control sequence output interface, for example an interface that transmits the control sequence to a magnetic resonance controller in order to directly control the measurement, or an interface that sends the data via a network and/or stores the data in a memory for later use. These interfaces can likewise be formed at least in part in the form of software and can possibly access hardware interfaces of a present computer.

The above object is also achieved in accordance with the invention by a non-transitory, computer-readable data storage medium encoded with programming instructions. When the data storage medium is loaded into a control sequence determination device, the programming instructions cause the control sequence determination device to implement any or all of the embodiments of the method described above. Similarly, when the data storage medium is loaded into a computerized control system of a magnetic resonance system, the programming instructions cause the computerized control system to operate the magnetic resonance system in any or all embodiments of the above-described method. Such a realization in software has the advantage that previous devices that are used to determine control sequences (suitable computers in computer centers of the magnetic resonance system manufacturer, for example) can also be modified via implementation of the program in a suitable manner in order to determine control sequences in the manner according to the invention, which control sequences are connected with a low radio-frequency exposure.

The parameter map is particularly preferably based only on image data of the first measurement. No selection—manual or automatic—thus takes place of an image region or a segment of the image region; rather, all image data (and therefore the entire image region) are used. For example, slice images of a follow-up measurement that allow an immediate assessment of the treatment progress can thus be generated without complicated image processing.

Furthermore, preferably using the parameter map, at least one local target flip angle is selected at a position in the image region (i.e. a voxel position) for the follow-up measurement depending on a value of the parameter map at this position in an image region of the first measurement. This particularly applies to voxels in the region of the target subject because, by varying the flip angle in the region of the target subject, it is possible to virtually transfer the target subject into the image of the follow-up measurement, and thus to enable an immediate assessment of the treatment progress. Naturally, target flip angles can also be determined for all positions; the entire image region is then used. The local target flip angles thus orient on the corresponding values of the parameter map, meaning that identical local flip angle values belong to the same image parameter values at different positions in the image region. Identical image regions are thus reproduced identically.

Arbitrary associations of the local target flip angle and the parameter value of the parameter map can be used, for example quadratic or root function associations. It is particularly preferably provided that the local target flip angle is selected in proportional dependency on the value of the parameter map in the image region of the first measurement. Identical local target flip angle changes thus lead to identical image parameter changes. A local flip angle is thereby determined, for example a maximum value for a local target flip angle (of 180°, for example) being multiplied with the value of the parameter map—for example the intensity value—for the appertaining voxel that was determined with the first measurement, and the product is divided by a maximum value of the parameter map, for example the maximum value for the intensity value. The maximum value of the parameter map thereby corresponds to the upper limit of the presentable values. A normalization and scaling of the local flip angles thus takes place in a simple manner in order to achieve optimal image data with the follow-up measurement.

It is preferable to check whether local flip angles lie in the saturation range—for example in the range of 180°—due to the local target magnetization distribution. The saturation range is a limit above which a correct measurement value acquisition and evaluation is no longer possible. It is thus prevented that unwanted incorrect measurements occur given which no assessment of the treatment progress is detectable due to local flip angles in the saturation range. For example, this would be the case if the calculation would lead to flip angle values that are greater than 180° (210°, for example) but are detected as flip angles of 30° due to the measurement data acquisition and evaluation.

The parameter map can also be created from image data of multiple measurements of the same image region. For example, T1-weighted image data, T2-weighted image data and/or image data for proton density measurement (PD image data) can thus be suitably linked with one another in order to generate a combined image whose spatially dependent intensity values are used directly or indirectly as a parameter map.

In principle, as described above no marking of the target subject is necessary in the invention. However, this does not preclude that a target subject is additionally marked in the image data. For example, this can take place in order to achieve an even stronger emphasis of the target subject if the demarcation in the data of the first measurement turns out to be insufficient, or in order to emphasize additional, specific regions (for example a safety margin around the target subject) that are not clearly emerging in the image data. The magnetic resonance system activation sequence is thus modified by this marking, and the visibility of the target subject is thus increased in a follow-up measurement if this is not necessary.

It is preferred that local flip angles are changed based on predetermined intensity changes, in particular greyscale value changes. The intensity or greyscale changes can thereby be image parameters—for example the parameter map. This allows an operator to manually implement intensity changes—in particular greyscale changes—at a terminal in order to mark the selected region, for example a tumor. However, color gradients and/or shadows can also be changed instead of greyscale changes. It is preferred that image data acquired with the first measurement are used in the form of one or more slice images to calculate the local target magnetization distribution. It is thus not absolutely necessary that volume image data from the first measurement are present in order to establish the target magnetization distribution in the manner according to the invention. The slice images (for example in a DICOM format or other standard format) can thereby be carried on a data medium by the patient or be sent via a network to the facility that implements the follow-up measurement.

Consequently, the parameter map can directly be a slice image acquired with a first measurement. A follow-up measurement can then supply image data in the form of a slice image (for example a slice image showing exactly the same image section) in which strong measurement signals are amplified for the respective voxels and weak measurement signals are attenuated for the respective voxels in regions without tissue change, such that the tumor variation arising during the course of the treatment—and therefore the treatment progress—is thus immediately detectable in the slice image.

However, a three-dimensional parameter map for the target magnetization distribution of the follow-up measurement can also be obtained based on multiple slice images, wherein suitable interpolation methods are possibly used to determine values between the slice images.

In a further embodiment the image data—for example in the form of one or more slice images—are inverted before the calculation of the local target magnetization distribution. This means that the inverted image data of the first measurement are thus used here (directly or possibly with additional modifications) as a parameter map to determine the local target magnetization distribution. The result is image data of the follow-up measurement, for example at least one additional, supplementary slice image in which strong measurement signals and weak measurement signals are amplified in regions without tissue variation. The contrast thus decreases, and the variation of the size of the tumor therefore markedly emerges from the point in time of the first measurement to the point in time of the follow-up measurement. The tumor variation arising during the course of the treatment—and therefore the treatment progress—are thus immediately detectable.

Additional follow-up measurements can follow the first follow-up measurement. The parameter map obtained with the first measurement can thus be used to determine the local target magnetization distribution for such a second follow-up measurement. The further progress and treatment success in the period of time between the first measurement and the second follow-up measurement can thus also be monitored. Image data of the first follow-up measurement or, respectively, an image parameter map obtained from this can be used as an alternative to the determination of the local target magnetization distribution. Moreover, the additional progress and treatment success in the time period between the first follow-up measurement and the second follow-up measurement thus can be monitored.

In principle, the target magnetization distribution can first be determined immediately before the follow-up measurement, using image data from a prior measurement or examination of a patient that has taken place earlier. Alternatively, a control protocol that contains at least one parameter map and/or calculated local target magnetization distribution can also be formed immediately after a first measurement. In addition to this, the control protocol can contain information about the image region or, respectively, section and the slice thickness and orientation. This control protocol can then already be created at the point in time just after the first measurement and can then be stored. This simplifies the implementation of the follow-up measurements since the stored control protocol simply must only be retrieved, and these data must only be assembled at the point in time of the follow-up measurement or, respectively, the monitoring examination. The control protocol can also be stored on a suitable data medium and be turned over to a patient so that the implementation of follow-up examinations is also possible at other sites and even independent of a given apparatus (within certain limits).

BRIEF DESCRIPTION OF THE DRAWINGS

FIG. 5 is a presentation of a pulse calculation based on the $B_1$ map according to FIG. 4.

FIG. 6 is a presentation (A) of a target specification for a desired flip angle distribution, and—for comparison—a presentation (B) of a result of a real Bloch simulation for how it would generate the calculated 8-channel RF pulse according to FIG. 5.

FIG. 7 shows two head images with a simulated tumor.

FIG. 8 is a presentation of a measurement of a process monitoring.

FIG. 9 is an additional presentation of a measurement of a process monitoring.

DESCRIPTION OF THE PREFERRED EMBODIMENTS

Figure 1:
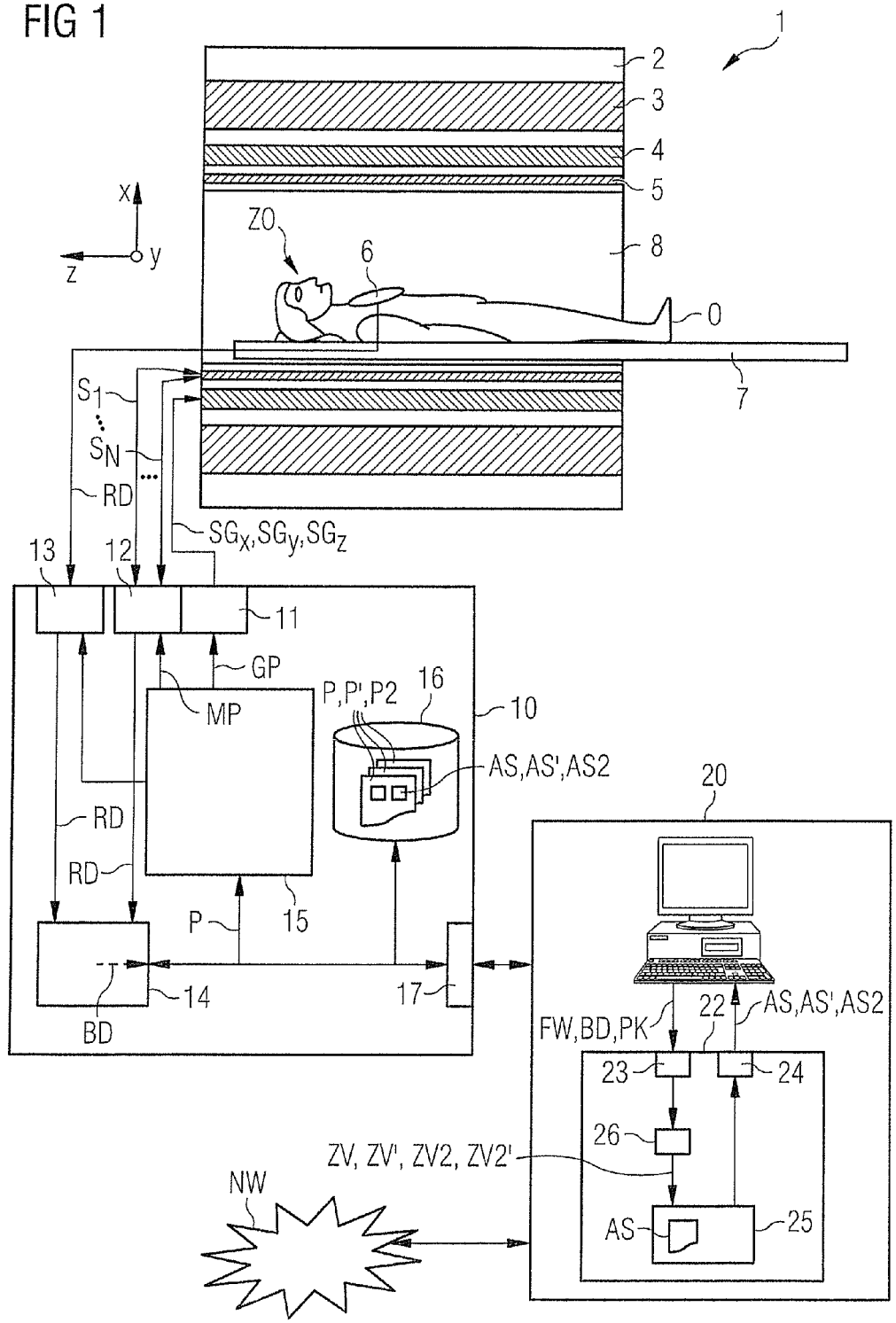
FIG. 1 is a schematic presentation of an exemplary embodiment of a magnetic resonance system according to the invention.

A magnetic resonance system 1 according to the invention is shown in a schematic manner in FIG. 1. The system 1 includes the actual magnetic resonance scanner 2 with an examination space or patient tunnel 8 located inside it. A bed 7 can be driven into this patient tunnel 8 so that, during an examination, an examination subject O (for example a patient lying on the bed 7) can be supported at a specific position within the magnetic resonance scanner 2 relative to the magnet system and the radio-frequency system located in the magnetic resonance scanner 2, can also be driven between different positions during a measurement.

Significant components of the magnetic resonance scanner 2 are a basic field magnet 3, a gradient system 4 with magnetic field gradient coils in order to apply arbitrary magnetic field gradients in the x-, y- and z-directions, and a whole-body radio-frequency coil 5 (body coil). The reception of magnetic resonance signals induced in the examination subject I can take place also via the whole-body coil 5 with which the radio-frequency signals are normally emitted to induce the magnetic resonance signals. However, these signals are typically received with local coils 6 placed on or below the examination subject O, for example. Aside from reception, these local coils 6 can also be used for transmission. All of these components are fundamentally known to those skilled in the art and therefore need only be shown schematically in FIG. 1.

Here the whole-body radio-frequency coil 5 is designed in the form of a birdcage antenna and has a number N of individual antenna rods that run parallel to the patient tunnel 8 and are distributed uniformly on a periphery around the patient tunnel 8. The individual antenna rods are respectively capacitively connected in an annular at their ends.

The individual antenna rods here can be activated separately by a control device 10 via individual transmission channels $S_1, \ldots, S_N$. The control device 10 can be a control computer which can embody multiple individual computers (that can possibly also be spatially separated and connected among one another via suitable cabling or the like).

This control device 10 is connected with a terminal 20 via a terminal interface 17 via which an operator can control the entire system 1. In the present case this terminal 20 (as a computer) is equipped with keyboard, one or more monitors and additional input devices (for example a mouse or the like) so that a graphical user interface is provided to the operator.

Among other things, the control device 10 includes a gradient control unit 11 that can in turn be composed of multiple sub-components. The individual gradient coils are activated with control signals $SG_x$, $SG_y$, $SG_z$ via this gradient control unit 11. These are gradient pulses that are set at precisely provided temporal positions and with a precisely predetermined time curve during a measurement (data acquisition).

The control device 10 also includes a radio-frequency transmission/reception unit 12. These RF transmission/reception unit 12 likewise can be composed of multiple sub-components in order to respectively assign radio-frequency pulses separately and in parallel to the individual transmission channels $S_1, \ldots, S_N$, i.e. to the individually controllable antenna rods of the body coil 5. Magnetic resonance signals can also be received via the transmission/reception unit 12, but, this typically occurs with the use of the local coils 6. The magnetic resonance signals detected with these local coils 6 are read out and processed by an additional RF transmission/reception unit 13. The magnetic resonance signals received by the local coils 6 or by the whole-body coil 5 and processed by the RF transmission/reception unit 12 are passed as raw data RD to the reconstruction unit 14, which reconstructs the image data BD from the raw data RD and stores the image data BD in a memory 16 and/or passes the image data BD to the terminal 20 via the interface 17 so that the operator can view the image. The image data BD can also be stored at other locations via a network NW and/or be displayed and evaluated.

The gradient controller 11, the RF transmission/reception unit 12 for the body coil 5 and the RF transmission/reception unit 13 for the local coils 6 are respectively activated in a coordinated manner by a measurement control unit 15. By means of appropriate commands this protocol causes a desired gradient pulse train GP to be emitted via suitable gradient control signals $SG_x$, $SG_y$, $SG_z$ and activates the RF control unit 12 in parallel so that a multichannel pulse train MP is emitted, meaning that the matching radio-frequency pulses are provided in parallel to the individual transmission rods of the whole-body coil 5 (for example at the individual transmission channels $S_1, \ldots S_N$. Moreover, it must be ensured that the magnetic resonance signals are read out at the local coils 6 at the matching point in time via the RF transmission/reception unit 13, signals are read out at the whole-body coil 5 via the RF transmission/reception unit 12, and these signals are processed further. The measurement control unit 15 emits the corresponding signals (in particular the multichannel pulse train MP) to the radio-frequency transmission/reception unit 12 and the gradient pulse train GP to the gradient control unit 11, according to a predetermined control protocol P. All control data that must be set during a measurement are stored in this control protocol P.

A number of different control protocols P respectively for different measurements are typically stored in a memory 16. These can be selected (and varied if necessary) by the operator via the terminal 20 in order to then have an appropriate control protocol P available for the currently desired measurement, with which control protocol P the measurement control unit 15 can operate. Moreover, the operator can also retrieve control protocols via a network NW (for example from a manufacturer of the magnetic resonance system) and then modify and use these as necessary.

The underlying workflow of such a magnetic resonance measurement and the components for activation are known to those skilled in the art, such that they need not be described in further detail herein. Moreover, such a magnetic resonance scanner 2 and the associated control device can have a number of further components that are likewise not explained in detail herein.

At this point it is noted that the magnetic resonance scanner 2 can also be of a different basic design, for example with a patient space that is open at one side. Moreover, the radio-frequency whole-body coil 5 does not need to be designed as a birdcage antenna. In the above example according to FIG. 1, the RF transmission/reception unit 12 with the body coil 5 and the RF transmission/reception unit 13 with the local coils 6 can each be viewed as transmission devices in the sense of the present invention. It is only necessary for the transmission device to have multiple separately controllable transmission channels $S_1, \ldots, S_N$.

A control sequence determination device 22 according to the invention that serves to determine a magnetic resonance system activation sequence AS is schematically shown in FIG. 1 as well. For (among other things) a defined measurement, this magnetic resonance activation sequence AS contains a predefined multichannel pulse train MP to activate the individual transmission channels $S_1, \ldots, S_N$. In the present case the magnetic resonance system activation sequence AS is created as part of the control protocol P.

Here the control sequence determination device 22 is shown as part of the terminal 20 and can be realized in the form of software components on the computer of this terminal 20. In principle, however, the control sequence determination device 22 can also be part of the control device 10 itself or be realized at a separate computer system, with the finished magnetic resonance activation sequences AS being transmitted (possibly also within the scope of a complete control protocol P) to the magnetic resonance system 1 via a network NW.

The control sequence determination device 22 has an input interface 23. Normally, a target magnetization and a gradient trajectory 23 (among other things) are provided to the control sequence determination device 22 via this input interface 23. Based on the target magnetization and gradient trajectory 23, an RF pulse optimization unit 25 of the control sequence determination device 22 automatically determines a specific activation sequence with an optimal multichannel pulse train to achieve the desired target magnetization. This can take place with a conventional pulse optimization method as noted above with reference to the article by W. Grishom et al., for example. The most varied optimization criteria can be taken into account, in particular criteria regarding the SAR exposure of the patient during the measurement. A homogeneous target magnetization distribution for the entire image region to be acquired in the subsequent measurement is typically provided. For example, this may simply mean that a target flip angle is established that should be homogeneously achieved upon emission of the $B_1$ pulses in the entire image region.

According to the invention, in a follow-up measurement FM the control sequence determination device 22 now receives image data BD (for example also via the input interface 23) of a first measurement (created at an arbitrary point in time) of the same image region of the patient that is to be acquired. For example, electronic slice images can be acquired via this interface (in particular in a DICOM format), such as slice images brought by the patient from a previous measurement, for a progress examination. Naturally, volume data of a complete 3D image region that is of interest for the follow-up measurement can likewise also be imported via this interface. This is particularly appropriate if such volume data are already stored in a memory of the system or are available via an interface (for example the network NW). A parameter map can be created based on the image data BD (as is explained in detail in the following); the parameter map can possibly be formed directly from the unmodified image data BD. The generation of a parameter map can take place by means of a processor (not separately shown, for example fashioned in the form of software) of the terminal, possibly also on the basis of commands that are received via a user interface. Instead of the image data BD, a parameter map based on the image data BD can also likewise be passed directly to the control sequence determination device 22 via the input interface 23.

This parameter map is then supplied to a target magnetization determination device 26 of the control sequence determination device 22, which determines a precise local target magnetization distribution or a target flip angle distribution for the desired measurement from the parameter map. In most cases it is thus no longer sought to achieve a homogeneous target flip angle in the entire image region (which is different than has previously been typical); rather, a target flip angle should be individually established locally for every single voxel or for different partial regions of the image region, this target flip angle depending on the image data of the previous measurement in a predefined manner. The parameter map can alternatively be obtained from the image data BD in a first step in the target magnetization determination device 26, or the parameter map can be modified further therein.

The local target magnetization distribution that is obtained in this manner is then passed to the RF pulse optimization unit 25 of the control sequence determination device 22, which automatically creates a defined activation sequence AS, AS' with an optimal multichannel pulse train MP to achieve the desired local target magnetization distribution ZV, ZV'.

These data are then output again via a control sequence output interface 24 and can then be passed to the control device 10 for the follow-up measurement, for example in a typical manner within the scope of a control protocol P in which additional specifications for the activation of the magnetic resonance system 1 (for example parameters for reconstruction of the images from the raw data etc.) are indicated.

In the following a measurement with the method according to the invention is explained as an example using FIGS. 2 through 9.

In the shown example, a progress measurement to monitor the shrinking of a tumor in the head during a radiation treatment is assumed. It is thereby initially shown using FIGS. 3 through 6 how a local target magnetization distribution can be determined based on image data of a previous measurement, with which local target magnetization distribution the image data for a follow-up measurement FM are then acquired.

Figure 3:
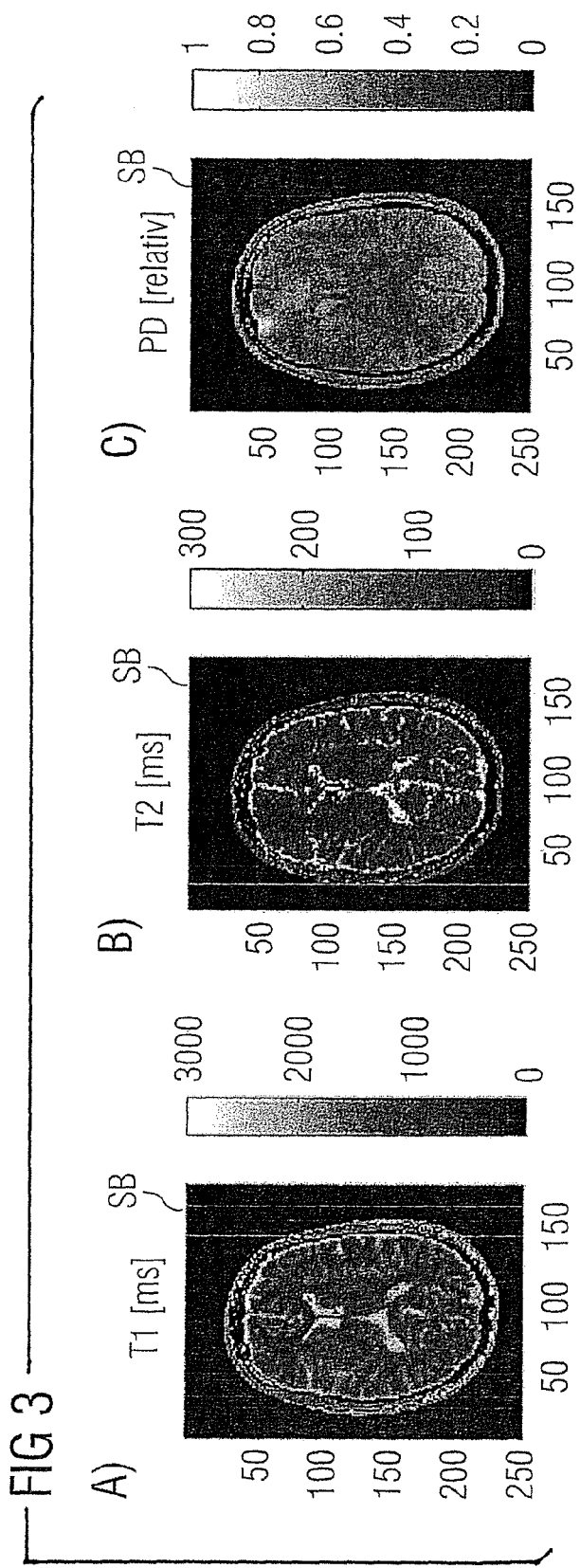
FIG. 3 shows an example of transverse head images that respectively include T1, T2 and PD data of an in vivo measurement.

For this FIG. 3 initially shows transversal slice images through the head of a test subject as a test data set. The entire left image A contains the T1 data, the middle image B contains the T2 data, and the right image C contains proton density data (PD data) of the measurement.

From this an MR image with the (spatially dependent) intensity $I_{MR}$ can be calculated for a basic spin echo sequence, for example with a standard excitation, given specification of the TR and TE times (TR is relaxation time and TE is the echo time):

$$I_{MR} = PD \cdot (1 - e^{-TR/T1}) \cdot e^{-TE/T2} \quad (1)$$

PD is a multidimensional vector that contains the spatially dependent image data of the PD measurement. The vector V1 correspondingly contains the image data from the T1 measurement, and the vector T2 contains the image data from the T2 measurement.

Such MR images can be used as a target magnetization for the calculation of a pTX pulse, i.e. a multichannel pulse train. In the following exemplary embodiment, a T1 weighting was used for the MR images.

An improvement of the image quality can thereby be achieved if patient-specific inhomogeneities are also taken into account in the calculation of the pTX pulse, in addition to apparatus-specific inhomogeneities. In addition to a $B_0$ map that is obtained via a measurement or simulation without patient and renders the homogeneity of the $B_0$ field as a map. For this purpose, maps known as $B_1$ maps can also be used that represent the spatial $B_1$ field distribution for every single one of the independent transmission channels, for example. The information from the $B_0$ map and the $B_1$ map can, for example, be used by the RF pulse optimization unit 25 to calculate the multichannel pulse train MP. The use of the $B_0$ map and the $B_1$ map thus allow that a multichannel pulse train (MP) that optimally precisely leads to the target magnetization is calculated under consideration of possible inhomogeneities of the magnetic fields.

For this, individual $B_0$ and/or $B_1$ maps can be determined for each patient via separate adjustment measurements before the actual measurement. Alternatively, it is possible to determine $B_1$ maps using one or more standard test bodies (using phantoms and/or test subjects), for example for different patient configurations (male, female, child for example), via measurements that are stored in a memory and then are retrieved as needed. It is likewise possible to obtain corresponding $B_0$ and/or $B_1$ maps via simulations with corresponding virtual standard test bodies (models). For example, for an 8-channel head coil in FIG. 4, $B_1$ maps and a $B_0$ map for all eight channels are shown using a model of a human head in a simulation.

Figure 4:
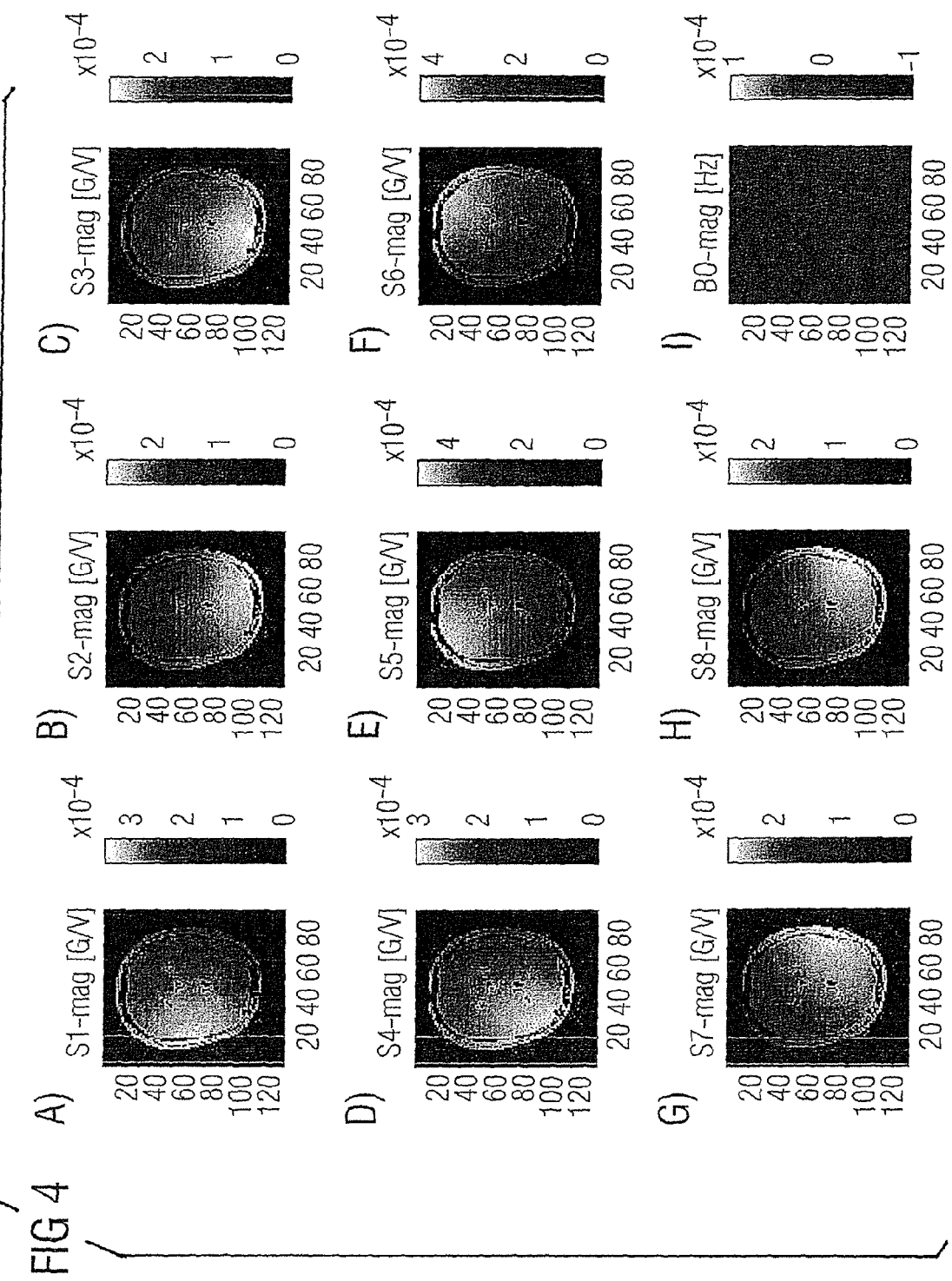
FIG. 4 is a presentation of calculated $B_1$ maps for an 8-channel head coil.

With the $B_0$ and $B_1$ maps shown in FIG. 4, an 8-channel RF pulse—i.e. a multichannel pulse train MP—as it is presented in sections in FIG. 5 can then be calculated with the aid of known optimization methods for a non-slice-selective excitation, for example given specification of a spiral gradient geometry. The target flip angle distribution that is provided as an example for this is reproduced to the left (Image A) in FIG. 6, wherein the target flip angle distribution in this case is based on the T1-weighted image (Image A from FIG. 3).

In FIG. 5, the voltage curve progressions (in V) are shown over time (in ms) in the uppermost diagram for the different channels. In the second-uppermost diagram, the phase curves (in °) matching these curves are shown over time. For the sake of completeness, shown below these in the three diagrams are the gradient pulses to be emitted in sync with these in the readout direction ($G_{RO}$; RO=Readout), in the phase coding direction ($G_{PE}$; PE=Phase Encoding) and slice selection direction ($G_{SS}$; SS=Slice Selection), respectively in mT/m. Here the readout direction is the x-direction and the phase coding direction is the y-direction. Since no slice selection should take place in this example, no gradient pulse is emitted in the slice selection direction (i.e. in the z-direction).

For comparison with the provided target flip angle distribution shown in Image A, on the right side (Image B) FIG. 6 shows the result of a real Bloch simulation of how the calculated 8-channel RF pulse shown in FIG. 5 was generated.

A comparison of the two images A and B shows that the desired target magnetization is achieved well. Here a local target magnetization distribution ZV, ZV' can thus be determined in this manner on the basis of a parameter map that was acquired in a first measurement, for example (here directly the image data of a T1-weighted image of the first measurement).

Figure 2:
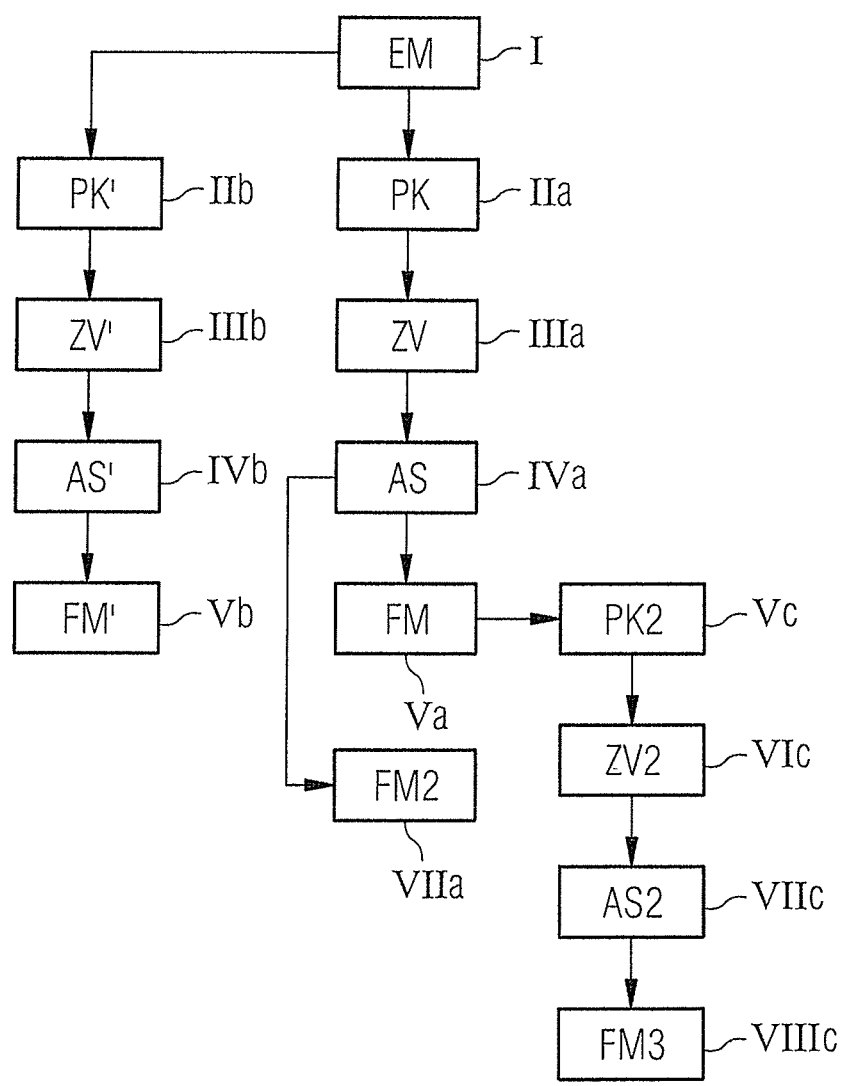
FIG. 2 is a flowchart of an exemplary embodiment of the method according to the invention.

The workflow of an examination sequence with a first measurement and follow-up measurements is explained in the following using the workflow diagram according to FIG. 2 in a very simple example with the aid of images from a simulation.

For this example, a simulated tumor T is introduced into the head image as an expansion of the calculation of the intensity $I_{MR}$ of the image data of the first measurement according to Equation (1) or to calculate the parameter map for the determination of the target magnetization of the follow-up measurement, in that the T1 value is simply increased by a factor of 2 at essentially the corresponding (circular) point.

Two corresponding head images for a spin echo sequence for a standard excitation are shown given identical head attitude in FIG. 7, wherein the left image A shows a simulation (generated as described in the preceding) of the state before the treatment and the right image B shows the simulated state after the treatment. The "tumor" is significantly smaller in Image B than in image A.

In the shown embodiment variant of the method according to the invention, an image region BB of the examination subject O—in this case the head with the tumor T—is first established after an overview scan (topogram). The tumor T is thus located within the image region BB. Image data BD should be acquired from this image region BB with a first measurement (EM) and also with the following follow-up measurements FM, FM', FM2.

In Step I a first measurement is subsequently implemented with a primary magnetization PM in order to record the state at the beginning of the therapy. In addition to the image section within which the tumor T is located, the established image region BB thereby also comprises the selected slice thickness and orientation.

For example, the magnetic resonance system 1 shown in FIG. 1, with a transmission device 5, 6, 12, 13 with a plurality of independent radio-frequency transmission channels $S_1, \ldots, S_N$, is used to implement the first measurement EM. A suitable activation sequence is used by an operator in order to achieve the primary magnetization in the selected image region BB for the first measurement EM. Based on this the control device 15 emits a multichannel pulse train MP with multiple parallel, individual RF pulse trains via the various radio-frequency transmission channels ($S_1, \ldots, S_N$) in order to achieve the desired primary magnetization PM of the first measurement EM. As a result of the first measurement EM, raw data RD then exist that—after their evaluation and conversion into image data BD—yield (for example) a T1-weighted slice image in which the tumor T is detectable. For example, this could appear like the Image A with the simulated "tumor" as shown on the right side in FIG. 7.

The parameter map PK is determined in Step IIa. For example, one or more unmodified slice images of the first measurement EM can be used as a parameter map. Alternatively, in Step IIB a parameter map PK' can be determined on the basis of one or more inverted slice images of the first measurement EM. In the following, for simplicity it is assumed that only a single slice image is respectively required (without limiting the invention to this).

Among other things, in Step IIIa or IIIb the parameter map PK or PK' is used in order to calculate a local target magnetization ZV, ZV' for the implementation of the follow-up measurements FM, FM'. The calculation of the local target magnetization distribution ZV, ZV' is implemented by the target magnetization determination unit 26 of the control sequence determination device 22. The use of an unmodified slice image leads to the local target magnetization ZV (see Step IIIa), and the use of an inverted slice image leads to a second local target magnetization ZV' (see Step IIIb). Both variants are shown in parallel in Steps IIa though IIIb [sic] and IIb through IIIb in FIG. 2.

If the image data BD of the first measurement EM are used without modification, the local target flip angle FW can be determined at the individual positions in the image region (i.e. for the individual voxels) for the follow-up measurement, depending on image parameter values (greyscale values, for example) at the corresponding positions in the image region of the first measurement EM, according to the following Equation:

$$FW = FW_{max} \cdot \frac{I_{MR}}{I_{MR,max}} \quad (2)$$

FW stands for the multidimensional vector that represents the local target flip angle distribution (i.e. respectively the local flip angle in the individual voxels at the various positions within the desired image region). The vector FW thus corresponds to the desired target magnetization distribution ZV, ZV'. $FW_{max}$ is a maximum value for the local flip angle FW of 180°, for example. $I_{MR}$ is the spatially dependent intensity according to Equation (1) (i.e. the intensity values for the individual voxels, for example in the form of grey or color values) in the image data BD of the first measurement EM. $I_{MR,max}$ is the maximum intensity value in the image data, i.e. in the vector $I_{MR}$. If the inverted image data of the first measurement EM should serve as a parameter map PK, the vector $I_{MR}$ accordingly contains the inverted values of the individual voxels of the first measurement EM. A normalization is automatically provided in that the maximum target flip angle FW can reach 180° in the follow-up measurement.

According to the following Equation, this local target magnetization distribution ZV, ZV'—which deviates from the homogeneous target magnetization or primary magnetization used for the first measurement EM—inevitably leads to the modified intensities $I_{MR}'$ in the image data of the follow-up measurement:

$$I_{MR}' = \sin(FW) \cdot PD \cdot (1 - e^{-TR/T1}) \cdot e^{-TE/T2} \quad (3)$$

A comparison of Equation (3) with Equation (1) immediately shows that the intensity $I_{MR}$ at the determined location within the image region now additionally depends on the sine of the flip angle FW at the respective location.

In Step IVa or IVb, a suitable magnetic resonance system activation sequence AS, AS' for a follow-up measurement FM, FM' for the same selected image region BB (see FIG. 7) is therefore calculated, with the aid of a conventional optimization method, with the same selected slice thickness and orientation by the RF pulse optimization unit 25 for the target flip angle distribution ZV, ZV' calculated according to Equation (2).

The magnetic resonance activation sequence AS calculated by the RF pulse optimization unit 25 for the local target magnetization distributions ZV, ZV' can then be checked further as to whether the local target flip angles FW lie in the saturation range, at least in segments, due to the local target magnetization distribution ZV, ZV'. If this is the case, the operator is informed about this via an automatically generated communication. Insofar as the local target flip angle FW does not lie in the saturation range, the local target magnetization distribution ZV, ZV' is output again via a control sequence output interface 24 and inserted into a control protocol P into which further additional specifications are introduced for activation of the magnetic resonance system 1. The control protocol P is subsequently stored.

Among other things, a first follow-up measurement FM, FM' is implemented in Step Va or, respectively, Vb. For this the magnetic resonance system activation sequence AS, AS' determined in Step IVa or, respectively, IVb is passed as described to the measurement control unit 15 of the control device 10 within the scope of the control protocol P, and the follow-up measurement FM, FM' is subsequently implemented. Image data BD of the follow-up measurement FM, FM' are thus acquired with selection of the same image region BB or, respectively, the stored image region BB and the same or, respectively, stored slice thickness and orientation.

In the present case, the result is a slice image SB of a follow-up measurement FM, FM' as it is shown in FIG. 8. Due to the specific establishment of the target magnetization distribution ZV, ZV' based on the image data BD of the previous measurement (the image data from Image A of FIG. 7 in the simulation for FIG. 8), strong signals are amplified in regions without tissue change (i.e. outside of the "tumor") and weak signals are weakened. As a result, the image contrast outside of the "tumor" is increased and the variation of the "tumor" T is visible. The tumor variation arising in the course of the treatment is thus immediately recognizable without the region of the tumor T having to be marked in the image data BD of the follow-up measurement FM, FM' according to the image data BD of the first measurement EM.

The first follow-up measurement FM implemented in Step Va can correspondingly be supplemented with the additional follow-up measurement FM' implemented in Step Vb. In this supplemented follow-up measurement FM', a control protocol P' is used that contains the magnetic resonance system activation sequence AS' that was determined on the basis of the second local target magnetization distribution ZV' for an inverted slice image.

FIG. 9 shows a simulated slice image of such a second follow-up measurement FM' in which a target magnetization distribution was established based on the inverted image data of the first measurement. In this image, strong signals and weak signals are amplified in regions without tissue variation (i.e. outside of the "tumor"). The contrast thus decreases, and the variation of the size of the tumor T from the point in time of the first measurement EM to the point in time of the follow-up measurement FM, FM' is therefore markedly emphasized. Here as well the tumor variation arising in the course of the treatment is thus immediately recognizable.

In Step VIa, to implement an additional monitoring measurement the control protocol P can be retrieved again in order to implement a second follow-up measurement FM2 (with which the additional progress of the treatment can be established) in Step VIIa using the magnetic resonance activation sequence AZ'. In this Step VIIa, among other things a slice image SB is thus acquired, for example, that enables a comparison with the first measurement EM.

Alternatively or additionally, in Step Vc it is possible to use the slice image SB obtained with the follow-up measurement FM in order to determine a new parameter map PK2, and from this to determine a local target magnetization ZV2 in Step VIc, and to calculate a new magnetic resonance system activation sequence for this in Step VIIc. This magnetic resonance system activation sequence AS2 is integrated into a new control protocol P2. With this control protocol P2 an additional follow-up measurement FM3 is then implemented in Step VIIc in order to acquire a slice image SB using the same image region BB and the same slice thickness and orientation, which allows an immediate assessment of the variations in comparison to the first follow-up measurements FM implemented in Step Va.

As was shown above, the invention improves the course monitoring of a therapy in a very simple manner. It is therefore possible to directly compare the degree of expansion of a tumor T directly with the information from previous measurements in the current image data, for example, without a manual marking of the tumor being necessary. A quantitatively improved progress monitoring of therapies is thus quantitatively possible. The procedure according to the invention thereby even allows follow-up examinations to also be implemented with different apparatus types than were used for the first measurement, since the calculation of the target magnetization distribution by means of a parameter map based on the image data of the previous measurement is apparatus-independent.

In conclusion, it is noted again that the previously described, detailed methods and designs are exemplary embodiments, and that the basic principle can be varied by those skilled in the art in a broad range without departing from the scope of the invention. The various shown examples of follow-up measurements and their combinations can be arbitrarily combined with one another in a series of follow-up examinations. Additional follow-up measurements can also be implemented based on inverted slice images, for example, and a new magnetic resonance activation sequence can possibly have been created in the meantime between two follow-up measurements.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to operate a magnetic resonance imaging apparatus to ensure that, in a follow-up data acquisition procedure, magnetic resonance data are acquired from at least a portion of a selected image region of a subject that corresponds to a selected image region of the subject from which magnetic resonance data were acquired in a preceding data acquisition procedure, wherein the subject exits the magnetic resonance apparatus between said preceding data acquisition procedure and said follow-up data acquisition procedure, said magnetic resonance imaging apparatus comprising a radio frequency (RF) radiator arrangement comprising a plurality of individually activatable RF radiators respectively activated by a plurality of independent RF transmission channels, said method comprising:

in a computerized processor, generating a multi-channel pulse train for use in said follow-up data acquisition procedure comprising a plurality of individual RF pulse trains to be respectively emitted in parallel by the respective RF radiators of the RF radiator arrangement, by said individual RF pulse trains being supplied to said respective transmission channels;

in said computerized processor, automatically identifying said at least a portion of said selected image region in said magnetic resonance image data acquired in said preceding data acquisition procedure;

in said computerized processor, determining a parameter map for said at least said portion of said selected image region in said follow-up data acquisition procedure from said at least a portion of said selected image region identified in said magnetic resonance image data acquired in said preceding data acquisition procedure;

in said computerized processor, using said parameter map to configure said multi-channel pulse train to achieve a defined, local target magnetization distribution, upon emission of said individual multi-channel pulse trains by said RF radiators of said RF radiator arrangement in said follow-up examination procedure, that ensures that said magnetic resonance data acquired in said follow-up data acquisition procedure will include at least said portion of said selected region identified in said magnetic resonance data acquired in said preceding data acquisition procedure; and making said multi-channel pulse train, configured to achieve said defined, local target magnetization distribution, available at an output of said computerized processor in a form for inclusion in an operating protocol to operate said magnetic resonance imaging apparatus.

2. A method as claimed in claim 1 comprising basing said parameter map only on said image data acquired from said selected image region in said preceding data acquisition procedure.

3. A method as claimed in claim 1 comprising configuring said multi-channel pulse train using said parameter map to select at least one target flip angle at a position in said selected image region for said follow-up data acquisition procedure depending on a value of said parameter map at said position in said selected image region acquired in said preceding data acquisition procedure.

4. A method as claimed in claim 3 comprising selecting said target flip angle proportionally dependent on said value of said parameter map.

5. A method as claimed in claim 3 comprising determining said local target flip angle based on predetermined intensity changes in said image data of said selected image region acquired in said preceding data acquisition procedure.

6. A method as claimed in claim 1 comprising, in said processor, checking whether local target flip angles, produced by said multi-channel pulse train, are at least partially contained in a saturation range produced by said defined, local target magnetization distribution.

7. A method as claimed in claim 1 comprising marking a target subject in said image data acquired from said selected image region in said preceding data acquisition procedure, and using the marked target subject as said at least said portion of said selected image region for acquiring data in said follow-up measurement.

8. A method as claimed in claim 1 comprising using at least one slice image acquired in said preceding data acquisition procedure to calculate said local target magnetization distribution for said follow-up data acquisition procedure.

9. A method as claimed in claim 1 comprising inverting said image data acquired in said preceding data acquisition procedure before calculating said local target magnetization distribution to obtain said parameter map.

10. A method as claimed in claim 1 wherein said follow-up data acquisition procedure is a first follow-up data acquisition procedure, and implementing a second follow-up data acquisition procedure in which said parameter map of said preceding data acquisition procedure is used to determine said local target magnetization distribution.

11. A method as claimed in claim 1 wherein said follow-up data acquisition procedure is a first follow-up data acquisition procedure, and implementing a second follow-up data acquisition procedure in which said parameter map of said first follow-up data acquisition procedure is used to determine said local target magnetization distribution.

12. A computerized control sequence determination device to operate a magnetic resonance imaging apparatus to ensure that, in a follow-up data acquisition procedure, magnetic resonance data are acquired from at least a portion of a selected image region of a subject, that corresponds to a selected image region of the subject from which magnetic resonance data were acquired in a preceding data acquisition procedure, wherein the subject exits the magnetic resonance apparatus between said preceding data acquisition procedure and said follow-up data acquisition procedure, said magnetic resonance imaging apparatus comprising a radio frequency (RF) radiator arrangement comprising a plurality of individually activatable RF radiators respectively activated by a plurality of independent RF transmission channels, said control sequence determination device comprising:

a processor configured to generate a multi-channel pulse train for use in said follow-up data acquisition procedure comprising a plurality of individual RF pulse trains to be respectively emitted in parallel by the respective RF radiators of the RF radiator arrangement, by said individual RF pulse trains being supplied to said respective transmission channels;

said computerized processor being configured to automatically identify said at least a portion of said selected image region in said magnetic resonance image data acquired in said preceding data acquisition procedure;

said processor being configured to determine a parameter map for said at least said portion of said selected image region in said follow-up data acquisition procedure from said at least a portion of said selected image region identified in said magnetic resonance image data acquired in said preceding data acquisition procedure;

said processor being configured to use said parameter map to configure said multi-channel pulse train to achieve a defined, local target magnetization distribution, upon emission of said individual multi-channel pulse trains by said RF radiators of said RF radiator arrangement in said follow-up examination procedure, that ensures that said magnetic resonance data acquired in said follow-up data acquisition procedure will include at least said portion of said selected region identified in said magnetic resonance data acquired in said preceding data acquisition procedure; and an output at which said processor makes said multi-channel pulse train, configured to achieve said defined, local target magnetization distribution, available in a form for inclusion in an operating protocol to operate said magnetic resonance imaging apparatus.

13. A magnetic resonance apparatus comprising:

a magnetic resonance data acquisition system configured to operate in a follow-up data acquisition procedure to acquire magnetic resonance data from at least a portion of a selected image region of an examination subject, for which selected image region magnetic resonance data were acquired in a preceding data acquisition procedure;

said magnetic resonance data acquisition system comprising a radio frequency (RF) radiator arrangement comprising a plurality of individually activatable RF radiators respectively activated by a plurality of independent RF transmission channels;

a computerized processor configured to generate a multi-channel pulse train for use in said follow-up data acquisition procedure comprising a plurality of individual RF pulse trains to be respectively emitted in parallel by the respective RF radiators of the RF radiator arrangement, by said individual RF pulse trains being supplied to said respective transmission channels;

in said computerized processor, automatically identifying said at least a portion of said selected image region in said magnetic resonance image data acquired in said preceding data acquisition procedure;

said computerized processor being configured to determine a parameter map for said at least said portion of said selected image region in said follow-up data acquisition procedure from said at least a portion of said selected image region identified in said magnetic resonance image data acquired in said preceding data acquisition procedure;

said computerized processor being configured to use said parameter map to configure said multi-channel pulse train to achieve a defined, local target magnetization distribution, upon emission of said multi-channel pulse trains by said RF radiators of said RF radiator arrangement in said follow-up examination procedure, that ensures that said magnetic resonance data acquired in said follow-up data acquisition procedure will include at least said portion of said selected region identified in said magnetic resonance data acquired in said preceding data acquisition procedure; and said computerized processor being configured to make said multi-channel pulse train, configured to achieve said defined, local target magnetization distribution, available at an output of said computerized processor in a form for inclusion in an operating protocol to operate said magnetic resonance imaging system.

14. A non-transitory, computer-readable storage medium encoded with programming instructions to operate a magnetic resonance imaging apparatus to ensure that, in a follow-up data acquisition procedure, magnetic resonance data are acquired from at least a portion of a selected image region of a subject, for which selected image region magnetic resonance data were acquired in a preceding data acquisition procedure, wherein the subject exits the magnetic resonance apparatus between said preceding data acquisition procedure and said follow-up data acquisition procedure, said magnetic resonance imaging apparatus comprising a radio frequency (RF) radiator arrangement comprising a plurality of individually activatable RF radiators respectively activated by a plurality of independent RF transmission channels, said storage medium being loaded into a computerized control and evaluation system of said magnetic resonance imaging apparatus and said programming instructions causing said control and evaluation system to:

generate a multi-channel pulse train for use in said follow-up data acquisition procedure comprising a plurality of individual RF pulse trains to be respectively emitted in parallel by the respective RF radiators of the RF radiator arrangement, by said individual RF pulse trains being supplied to said respective transmission channels;

in said computerized processor, automatically identifying said at least a portion of said selected image region in said magnetic resonance image data acquired in said preceding data acquisition procedure;

determine a parameter map for said at least said portion of said selected image region in said follow-up data acquisition procedure from said at least a portion of said selected image region identified in said magnetic resonance image data acquired in said preceding data acquisition procedure;

use said parameter map to configure said multi-channel pulse train to achieve a defined, local target magnetization distribution, upon emission of said individual multi-channel pulse trains by said RF radiators of said RF radiator arrangement in said follow-up examination procedure, that ensures that said magnetic resonance data acquired in said follow-up data acquisition procedure will include at least said portion of said selected region identified in said magnetic resonance data acquired in said preceding data acquisition procedure; and make said multi-channel pulse train, configured to achieve said defined, local target magnetization distribution, available at an output of said computerized processor in a form for inclusion in an operating protocol to operate said magnetic resonance imaging apparatus.

* * * * *